United States Patent [19]

Ribic

[11] Patent Number: 5,394,475
[45] Date of Patent: Feb. 28, 1995

[54] METHOD FOR SHIFTING THE FREQUENCY OF SIGNALS

[76] Inventor: Zlatan Ribic, Kirshstetterngasse 13, A-1160 Vienna, Austria

[21] Appl. No.: 970,143

[22] Filed: Nov. 2, 1992

[30] Foreign Application Priority Data

Nov. 13, 1991 [AT] Austria .................................. 2246/91

[51] Int. Cl.$^6$ ............................................. H04R 25/00
[52] U.S. Cl. .................... 381/68.2; 381/106; 381/94
[58] Field of Search .................. 381/68.2, 94, 106, 62, 381/68, 68.4; 84/706; 328/15

[56] References Cited

U.S. PATENT DOCUMENTS

| | | | |
|---|---|---|---|
| 4,304,162 | 12/1981 | Schreier | 381/62 |
| 4,461,025 | 7/1984 | Franklin | . |
| 4,463,650 | 8/1984 | Rupert | 84/1.19 |
| 4,495,643 | 1/1985 | Orban | 381/94 |

FOREIGN PATENT DOCUMENTS

| | | |
|---|---|---|
| 0329383 | 8/1989 | European Pat. Off. . |
| 2562354 | 10/1985 | France . |
| 57113646 | 7/1982 | Japan . |
| 1136407 | 5/1989 | Japan . |

OTHER PUBLICATIONS

CMOS Cookbook by Don Lancaster, First Edition, Fourth Printing–1979, pp. 358–361.
Alfred Constam: "Some Comments on Transposition systems".
M. H. Jones: "Frequency Shifter for 'Howl' Suppression" Wireless World, Jul. 1973.

Primary Examiner—Curtis Kuntz
Assistant Examiner—Huyen D. Le
Attorney, Agent, or Firm—Collard & Roe

[57] ABSTRACT

Method and device for transposing the frequency of an input signal, in particular for hearing aids, comprising:
an analytical circuit (AS) with which are produceable a momentary frequency signal w(t) whose strength is proportional to the momentary frequency of the input signal $u_i(t)$ and a momentary amplitude signal A(t) whose strength is proportional to the momentary amplitude of the input signal $u_i(t)$;
a voltage-controlled oscillator (VCO) which is connected to the output of the analytical circuit (AS) that supplies the frequency signal w(t);
a multiplier (M) with two inputs, of which one of them is connected to the output of the voltage-controlled oscillator (VCO) and the other to the output of the analytical circuit (AS) supplying the amplitude signal A(t).

20 Claims, 5 Drawing Sheets

METHOD FOR SHIFTING THE FREQUENCY OF SIGNALS

BACKGROUND OF THE INVENTION

1. Field of the Invention

The invention relates to a method for shifting the frequency of signals.

2. The Prior Art

Modern electroacoustic transmission systems, ranging from PA systems to hearing aids for persons with impaired hearing faculty, usually fulfill a number of main functions such as:

amplifying;
filtering;
regulating the volume (AGC-, ASP-systems).

In all these processes the output signal frequency remains substantially the same as the input signal frequency. The transmission system itself ideally does not produce any new signal components. In practice, however, the output signal does contain distortions and noise components. These changes are disturbing and undesirable and efforts are made to keep this part as small as possible.

Principally, the following can asserted:

$$v_o(t) = K v_i(t-T_o) + K_n n v_i(t-T_o) + N + IM$$

with $v_o(t)$ being the output signal at the time t, K being the momentary amplification, $v_i(t)$ being the input signal at the time t, $T_o(t)$ being the delay time, $K_n$ being the distortion factor, n being 2, 3, ..., N being the noise, and IM being the intermodulation.

The first term on the right side of the equation represents the desired signal. The second term relates to the harmonic which might occur under certain circumstances.

All components of the input signal remain at the same position in the spectrum of the output signal, i.e., the frequency stays the same.

Now it can be preferable for certain purposes to transpose the frequency spectrum in such a way that the spectrum of the output frequencies is shifted more or less strongly with respect to the input frequencies.

A very important practical application of the frequency transposition would be, for example, the suppression of acoustic feedback in the event of high amplifications. By shifting the frequency the feedback problems in large amplifications are either reduced or even fully eliminated. The explanation for this is rather simple. Due to the frequency shift of the output signal with respect to the input signal there is no build-up effect on the input in the event of a feedback because the output signal will always be slightly different than the input signal. Furthermore, the already frequency-shifted signal is continuously shifted from a highly amplified transmission area to one with a low amplification. Even a small transposition produces several dB of usable amplification.

Another very important application is the field of hearing aids for persons with impaired hearing: There have been experiments to shift speech information (input signal) in the spectral position (frequency) in order to transpose the signal to a residual hearing range of a person with an impaired hearing faculty, so that this person is able again to hear all of the information. The frequency shift enables such a person to hear all important information that previously lay outside of his hearing range. Impaired hearing occurs more frequently in the higher frequency ranges than in the lower ones. By shifting the desired signal to said lower frequency range it is possible to help persons even with considerable hearing losses.

Following this there is the problem of frequency shifts during the transmission of data through telephone lines and the like. In this case it may under certain circumstances be undesirable to shift the frequency of signal that already has been modulated by a modem without impairing the information contents.

A language recording that is played back more slowly (as is well known from tape recorders, for example) can usually be understood quite well as long as the transposition factor does not exceed a certain value. Thus, this method would be ideal for frequency transpositions. In this context there is known a method with rotating sound heads, which, however, has proved to be deficient because some time segments were lost and a real-time application simply could not be implemented.

It was also considered to provide a fast Fourier transformation analysis (known as FFT), frequency shifting and inverse FFT. This method could be realized, but it requires considerable efforts and usually fails in its realization because of the limits that are placed on limits in the size of integrated circuits.

It was then proposed to carry out an approximative frequency analysis of the signal in order to determine singal components between 200 and 400 Hz, between 400 and 650 Hz, etc. If each of these signal portions drives an oscillator, it is possible to realize the frequency shift in such a way that the oscillator is tuned to a frequency outside of the respective range. Such a circuit, a vocoder system according to Pimonov, is disclosed in A. Costam: "Some views on transposition systems". Such a device is not able to produce a useful system when using only a few filters. If, however, a sufficient number of filters are used, the efforts required for the circuit are simply too big for many practical applications.

Furthermore, from M. H. Jones: "Frequency Shifter for "Howl" Suppression", in: Wireless World, July 1973, it is known to a make a frequency shift by a fixed amount, approx. 5 Hz. It is, however, not possible to produce larger shifts, because it changes the sound intervals. Language becomes indistinct even in small shifts.

All told, until the present day no effective method is known for frequency transposition. Although digital technology has entered into hearing aid technology, it cannot be used for pure and complex signal processing.

SUMMARY OF THE INVENTION

It is the object of the present invention to avoid such disadvantages and to propose a circuit and a method of the kind mentioned above which enables a frequency transposition in real time in a simple manner and with low efforts required for the circuitry.

A further object of the invention consists of developing a shifting method in which the sound intervals remain substantially unchanged. This means that there should be a logarithmic frequency shift.

In accordance with the invention the following steps are provided:

The generation of an analytical signal consisting of two Hilbert signals $h_1(t)$, $h_2(t)$, whose energy spectrum is equivalent to that of the input signal $v_i(t)$ The differentiation and the combination of the Hilbert signals $h_1(t)$ and $h_2(t)$ to generate a momentary frequency Signal $wA(t)$ and $A(t)$.

The generation of an output signal $v_o(t)$ whose momentary frequency is equivalent to the respective momentary frequency $w(t)$ which equals $WA(t)$ divided by $A(t)$.

A complex signal is regarded as analytical signal if its imaginary component represents the Hilbert transform of the real component. The mathematical principles are known and have been explained in detail in: R. B. Randall: "Frequency Analysis", Bruel & Kjaer, 1987. Due to this property the two components of the analytical signal are referred to hereinafter as Hilbert signals.

Depending on the tuning of the circuit in which this process is carried out the output signal has a frequency that is higher or lower than that of the input signal. In any case, the frequency of the output signal is shifted by a multiplicative factor. Thus, all sound intervals remain unchanged. Such a method can be implemented very easily within a circuit and it has been seen that the transposed signals can be understood very well.

It may be provided that the momentary frequency signal $w(t)$ is subjected to a controlling means. In this way it is possible to change the extent of the frequency shift. The control can be made manually through a potentiometer (possibly by the carrier of the hearing aid) or depending on the volume encountered.

It is possible that the momentary frequency signal $w(t)$ is amplified or attenuated in a non-linear manner. This leaves the approach of carrying out a shift by a constant frequency factor, but in this way it is possible to compress the frequency spectrum. In the event of severe hearing impairments this can often be the only way to transpose the whole speech information into a remaining narrow frequency window. Such a procedure might also be necessary for data transmissions. Due to the non-linear member it is also very easily possible to shift higher frequencies of the input signal more strongly in the direction towards lower frequencies than middle frequencies of the hearing range, for example. In this way it is possible change certain frequency ranges of the input signal more strongly than other frequency ranges. This is of particular importance for an application of the circuit in accordance with the invention for hearing aids for persons with hearing impairments. Thus, hearing losses usually do not occur linearly over the whole frequency spectrum, they usually occur more frequently in higher frequency ranges.

Thus, the less damaged hearing ranges of the user could be used and the received sound signals could be emitted via the circuit in accordance with the invention more strongly in frequency ranges in which the user still has his best hearing capabilities.

In audio signals, a part of the transmitted information is contained in the amplitude. When shifting the frequency of audio signals $v_i(t)$, in particular for hearing aids, it is preferable if the output signal $v_o(t)$ is produced with a voltage-controlled oscillator (VCO) and thereafter multiplied with a momentary amplitude signal $A(t)$ whose strength is substantially proportional to the amplitude of the input signal $v_i(t)$. The signal produced according to such a method is equivalent to the input signal, with the exception of the frequency shift.

Preferably the amplitude signal $A(t)$ is amplified or attenuated in a non-linear manner before the multiplication. In this way it is possible to change the volume of sound in a purposeful manner. Depending on the requirements either a compression or expansion will take place. In the case of hearing aids it has been proved that a compression in which stronger spectral components of signals with a low amplitude are amplified disproportionally within the time and frequency domain provide a more preferable suppression of noise. Another important advantage in the method in accordance with the invention consists of the fact that attack times and release times are zero.

The momentary frequency signal $w(t)$ can be produced in a preferable manner with the following steps:

Generation of an analytical signal consisting of two Hilbert signals $h_1(t)$, $h_2(t)$, whose energy spectrum is equivalent to that of the input signal $v_i(t)$.

Differentiation of the two Hilbert signals $h_1(t)$, $h_2(t)$.

Formation of the square root $wA(t)$ of the sum of the squares of the differentiated signals $d_1(t)$ and $d_2(t)$.

Division of the thus gained signal $wA(t)$ by a momentary amplitude signal $$A(t) = \sqrt{h_1^2(t) + h_2^2(t)}$$

whose strength is substantially proportional to the momentary amplitude of the input signal $v_i(t)$.

The Hilbert transformation produces from one function another function whose amplitude spectrum is identical, but whose phase relation is shifted in all frequencies by $\pi/2$. Principally it would be possible to subject the input signal $v_i(t)$ to such a Hilbert transformation. This, however, is very difficult to realize in a circuit. Nevertheless it is easily possible to generate two output signals $h_1(t)$ and $h_2(t)$ that both coincide with the input signal $v_i(t)$ in the energy spectrum and whose phase relation among one another is shifted by $\pi/2$.

The momentary amplitude signal $A(t)$ is preferably gained in such a way that the square root is formed from the sum of the squares of the two Hilbert signals $h_1(t)$ and $h_2(t)$.

In accordance with a further variation it is also possible to produce the momentary frequency signal $w'(t)$ with the following steps:

Generation of an analytical signal consisting of two Hilbert signals $h_1(t)$, $h_2(t)$, whose energy spectrum is equivalent to that of the input signal $v_i(t)$.

Differentiation of the two Hilbert signals $h_1(t)$, $h_2(t)$.

Addition of the absolute values of the differentiated signals $d_1(t)$ and $d_2(t)$.

Division of the thus obtained signal $H(t)$ by the sum $G(t)$ of the absolute values of the two Hilbert signals $h_1(t)$ and $h_2(t)$.

This, however, is not a precise method, but it requires less complex circuitry. Moreover, the deviation of the approximated frequency signal $w'(t)$ from the precise signal $w(t)$ is so much the smaller, the more a certain frequency dominates in the input signal.

The invention further relates to a device for shifting the frequency of signals $v(t)$.

In accordance with the invention a frequency signal circuit is provided with which a momentary frequency signal $w(t)$ is produceable and a voltage controlled oscillator which is connected to the output of the frequency signal circuit. The frequency of the signal produced by this oscillator is at all times proportional to the strength of the input signal.

Preferably, a controlling means and/or a non-linear transformer is/are disposed between the frequency signal circuit and the voltage-controlled oscillator.

When being used in hearing aids, the device in accordance with the invention can be equipped with:
- an analytical circuit with which a momentary frequency signal w(t) and a momentary amplitude signal A(t) are produceable;
- a voltage-controlled oscillator which is connected to the output of the analytical circuit that supplies the frequency signal w(t);
- a multiplier with two inputs of which one is connected to the output of the voltage-controlled oscillator and of which the other is connected to the output of the analytical circuit that supplies the momentary amplitude signal A(t).

A non-linear transformer may also be disposed between the multiplier and the output of the analytical circuit that supplies the momentary amplitude signal A(t). In this connection it may further be provided that a mixer is connected subsequently to the voltage-controlled oscillator, the second input of said mixer being connected with the input, whereby the non-linear transformer is optionally also connected with the input of the signal dividing circuit at the input side.

In this way it is possible to mix the input signal with the output signal of the circuit in accordance with the invention, thus preventing the distortion of the output signals with respect to the input signals. This prevents an excessive distortion of speech, which would otherwise require a considerable time for getting accustomed to. By influencing the non-linear transformer by the input signal of the signal dividing circuit it is possible to achieve a further adjustment of the characteristics of the circuit according to the invention to the requirements of a user of a hearing aid, for example.

BRIEF DESCRIPTION OF THE DRAWINGS

The invention will now be outlined in greater detail by reference to the embodiments shown in the Figures, in which.

DETAILED DESCRIPTION OF PREFERRED EMBODIMENTS

Figure 1:
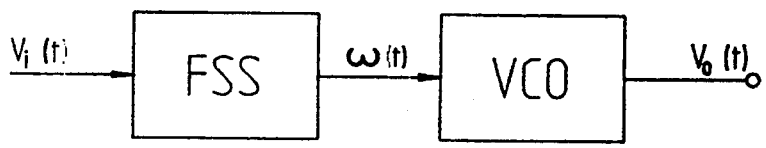
FIGS. 1 to 4 show block diagrams of various embodiments of the device in accordance with the invention.

FIG. 1 shows that the device in accordance with the invention is composed in the simplest case of a frequency signal circuit FSS and a voltage-controlled oscillator VCO. The frequency signal circuit FSS generates from the input signal $v_i(t)$ a frequency signal w(t) whose momentary strength is substantially proportional to the momentary frequency of the input signal $v_i(t)$. The frequency signal w(t) is transformed in the voltage-controlled oscillator VCO into the output signal $v_o(t)$.

Figure 2:
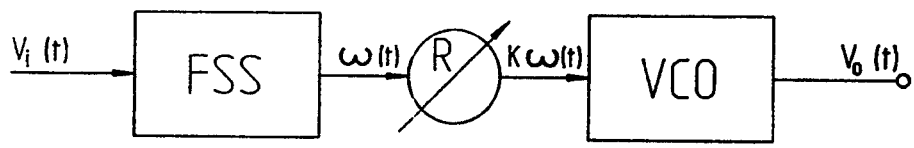

In the embodiment of FIG. 2 a controlling means R is provided in front of voltage-controlled oscillator VCO, so that the extent of the frequency shift is adjustable. This controlling means R is in the simplest of cases a potentiometer which can be set by the user of the hearing aid.

Figure 3:
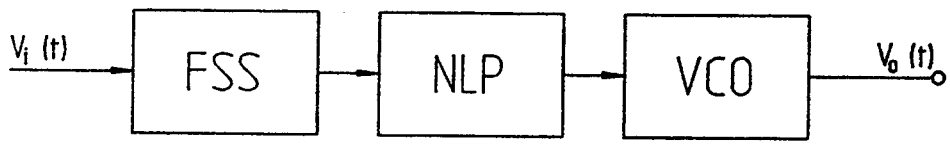

In FIG. 3 a non-linear transformer is provided in order to shift individual frequency ranges to different extents. Thus it is possible, for example, to transpose signal parts with a higher frequency to the middle or low frequency ranges by means of a strong shift without shifting all other signal parts too much.

Figure 4:
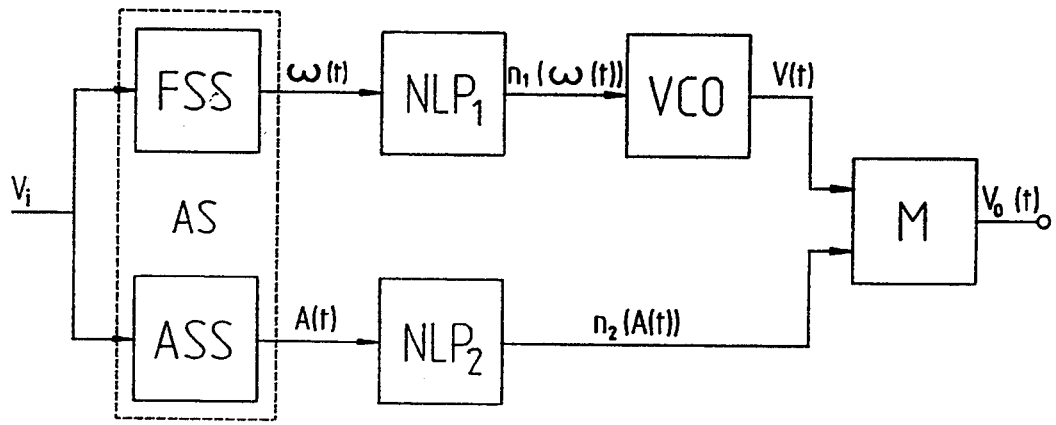

In the cases described until this point the amplitude of the output signal $v_o(t)$ is substantially constant and independent of the amplitude of the input signal $v_i(t)$. FIG. 4 shows the general case. The input signal $v_i(t)$ is supplied to an analytical circuit which generates a momentary amplitude signal A(t) and a momenatary frequency signal w(t). The portion of the analytical circuit AS that produces the frequency signal w(t) can be designated as frequency signal circuit FSS and the portion producing the amplitude signal A(t) can be termed amplitude signal circuit ASS. These portions can be arranged in form of a combination or separately.

Both the momentary frequency signal w(t) as well as the momentary amplitude signal A(t) are distorted by the non-linear transformers $NLP_1$ and $NLP_2$. The signal $n_1(w(t))$ supplied at the output of the transformer $NLP_1$ drives the voltage-controlled oscillator VCO. The signal v(t) supplied to the output of the voltage-controlled oscillator VCO is multiplied in a multiplier M with the signal $n_2(A(t))$ supplied at the output of the transformer $NLP_2$. Transformer $NLP_1$ has an influence on the extent and the type of the frequency shift, as has been described in FIG. 3. The transformer $NLP_2$ can be used to adjust the volume behaviour. A compression is possible in case of a sublinear characteristic of $NLP_2$ and an expansion is possible in case of an overlinear characteristic. This provides effective means for suppressing background noises.

Figure 5:
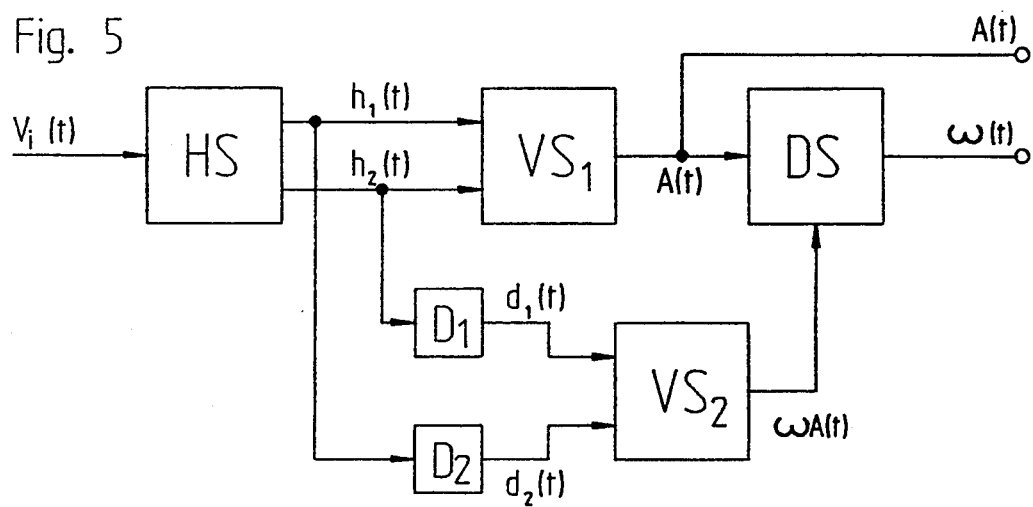
FIGS. 5 and 6 show block diagrams of variations of the analytical circuit.

FIG. 5 shows an embodiment of the frequency signal circuit FSS. In the Hilbert circuit HS two Hilbert signals $h_1(t)$ and $h_2(t)$ are produced which have the same energy spectrum as the input signal $v_i(t)$ and whose phases are shifted towards each other by $\pi/2$. Furthermore, two differentiators $D_1$ and $D_2$ are provided which are connected to the outputs of the Hilbert circuit HS. A first combinatorial circuit $VS_1$ is connected with its inputs to the outputs of the Hilbert circuit HS and, when being supplied with the signals $h_1(t)$, $h_2(t)$ to its inputs, produces an output signal A(t) according to the following algorithm:

$$A(t) = \sqrt{h_1^2(t) + h_2^2(t)}.$$

A second combinatorial circuit $VS_2$ is connected with its two inputs to the differentiators $D_1$ and $D_2$ and, when being supplied with the signals $d_1(t)$ and $d_2(t)$ to its inputs, produces an output signal wA(t) according to the following algorithm:

$$wA(t) = \sqrt{d_1^2(t) + d_2^2(t)}.$$

A divider circuit DS is connected with its inputs to the combinatorial circuits $VS_1$ and $VS_2$ and generates an output signal w(t) according to the following formula:

$$w(t) = wA(t)/A(t).$$

Thus, said output signal w(t) is a frequency signal which is required for further processing in the voltage-controlled oscillator VCO. However, it is possible to gain the amplitude signal A(t) after the first combinatorial circuit, so that the circuit represented in FIG. 5 could also be a fully adequate analytical circuit, as is required for example in FIG. 4.

Figure 6:
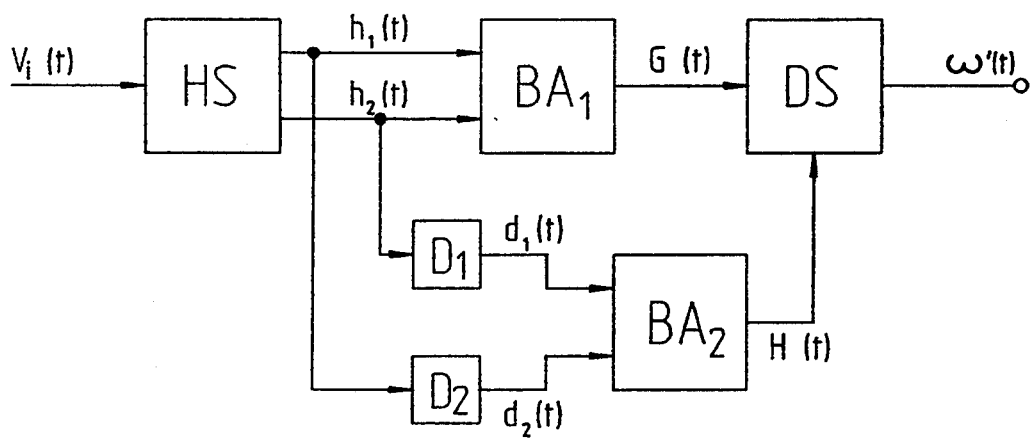

The embodiment of the frequency signal circuit FSS shown in FIG. 6 comprises the following elements:

a Hilbert circuit HS with two outputs, to which are supplied two Hilbert signals $h_1(t)$ and $h_2(t)$ gained from an input signal $v_i(t)$, of which a signal $h_1(t)$ represents the Hilbert transformation of the respective other signal $h_2(t)$;

two differentiators $D_1$ and $D_2$ which are connected to the outputs of the Hilbert circuit (HS);

a first absolute value adder $BA_1$ which with its two inputs is connected to the outputs of the Hilbert circuit HS and which generates from the signals $h_1(t)$, $h_2(t)$ supplied to the inputs an output signal G(t) according to the following algorithm:

$$g(t) = |h_1(t)| + |h_2(t)|$$

a second absolute value adder $BA_2$ which with its two inputs is connected to the differentiators $D_1$ and $D_2$ and which generates from the signals $d_1(t)$, $d_2(t)$ an output signal H(t) according to the following algorithm:

$$H(t) = |d_1(t)| + |d_2(t)|$$

a divider circuit DS which with its inputs is connected to the two absolute value adders $BA_1$ and $BA_2$ and which produces an output signal w'(t) in accordance with the following formula:

$$w'(t) = H(t)/G(t)$$

The output signal w'(t) constitutes an approximation for the frequency signal w(t).

Figure 7:
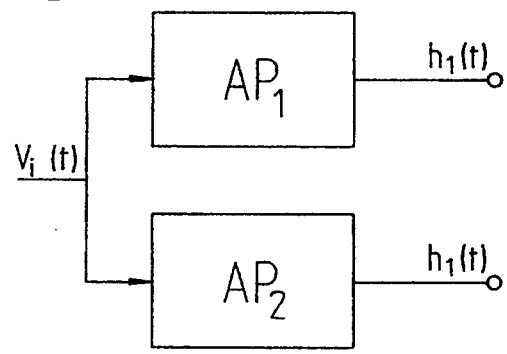
FIG. 7 shows a block diagram of the Hilbert circuit.

From FIG. 7 it can be seen that the Hilbert circuit HS may consist of at least two allpasses $AP_1$ and $AP_2$. The transformation behaviour of the allpasses $AP_1$, $AP_2$ is selected in such a way that Hilbert signals $h_1(t)$, $h_2(t)$ are supplied to the two outputs within the desired frequency range, of which one signal $h_1(t)$ represents the Hilbert transformation of the respective other signal $h_2(t)$.

Figure 8:
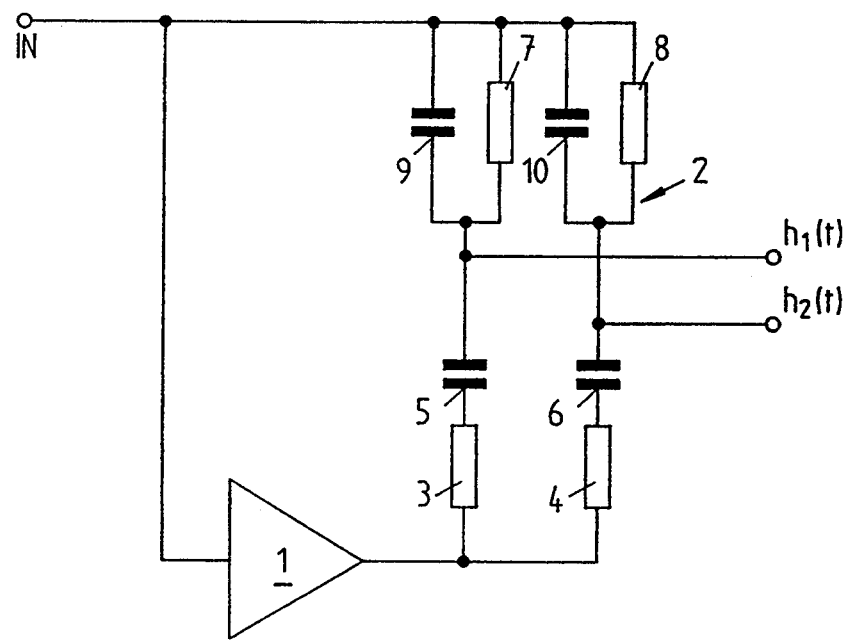
FIG. 8 shows the constructional realization of a Hilbert circuit.

FIG. 8 shows the details of a possible arrangement of the Hilbert circuit HS in accordance with FIG. 7. The input IN is connected in the known manner with an amplifier 1 and a bridge circuit 2 whose two branches are connected with the output of amplifier 1.

The two branches of the bridge circuit 2 are each formed by a series connection of a resistor 3, 4 with a capacitor 5, 6 and by the coupling in parallel of a resistor 7, 8 with a capacitor 9, 10 with each being connected to one another and the components in both branches being provided with different dimensions. The two output signals $h_1(t)$ and $h_2(t)$ are tapped from the connecting points of the series R/C elements with the parallel R/C elements. The resistors and capacitors should be selected at suitable dimensions.

Figure 9:
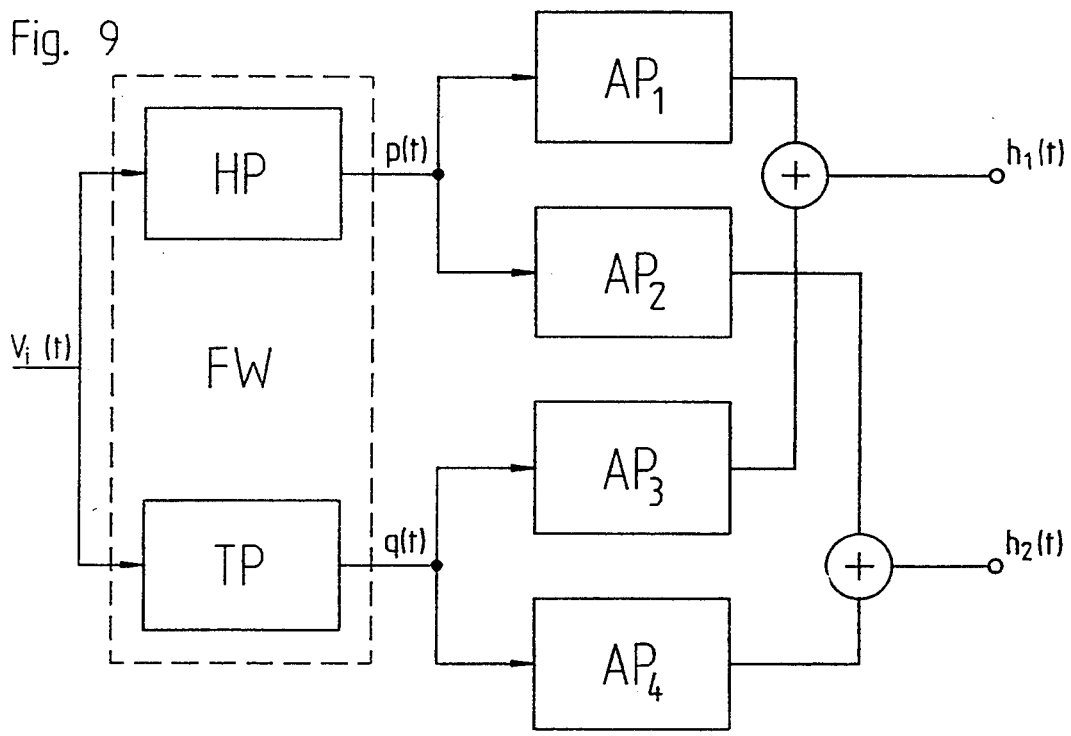
FIG. 9 shows a block diagram of a variation of the Hilbert circuit.

If the frequency range in which the Hilbert transformation is carried out sufficiently precisely is too narrow in the circuit in accordance with the circuit of FIGS. 7 and 8, a frequency separating filter FW may be provided which, for example, consists of a highpass HP and lowpass TP, as is shown in FIG. 9. The partial signals p(t) and q(t) are transformed separately by means of several pairs of all-passes $AP_1$, $AP_2$, $AP_3$, $AP_4$ and added thereafter in order to obtain the Hilbert signals $h_1(t)$ and $h_2(t)$.

Figure 10:
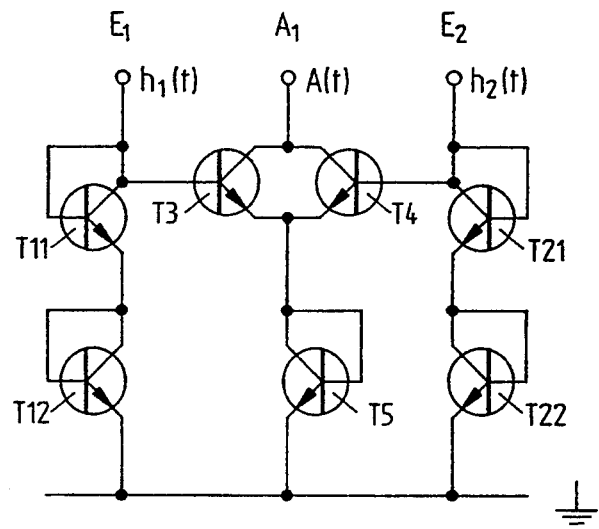
FIG. 10 shows the constructional realization of the logic circuit.

FIG. 10 shows a combinatorial circuit which generates from the signals $h_1(t)$, $h_2(t)$ applied to inputs $E_1$ and $E_2$ the signal:

$$A(t) = \sqrt{h_1^2(t) + h_2^2(t)}.$$

In an analogous manner it is possible to produce from the signals $d_1(t)$, $d_2(t)$ applied to inputs $E_1$ and $E_2$ the following signal:

$$wA(t) = \sqrt{d_1^2(t) + d_2^2(t)}.$$

Such a circuit is known from FERRANTI: Analog IC-Design, 1980, for example. It consists of two series connections of transistors T11, T12, T21 and T22 whose bases are connected with their collectors. The input signals $h_1(t)$ and $h_2(t)$ to be combined are supplied to said series circuits. Said series connections are further connected to the bases of two transistors T3, T4 connected in parallel. A further transistor T5 is connected to these in series. The base of transistor T5 is connected to its collector. A current A(t), which is equivalent to $$A(t) = \sqrt{h_1^2(t) + h_2^2(t)},$$

flows through the transistors T3, T4, whereby $h_1(t)$ and $h_2(t)$ are the input currents.

Figure 11:
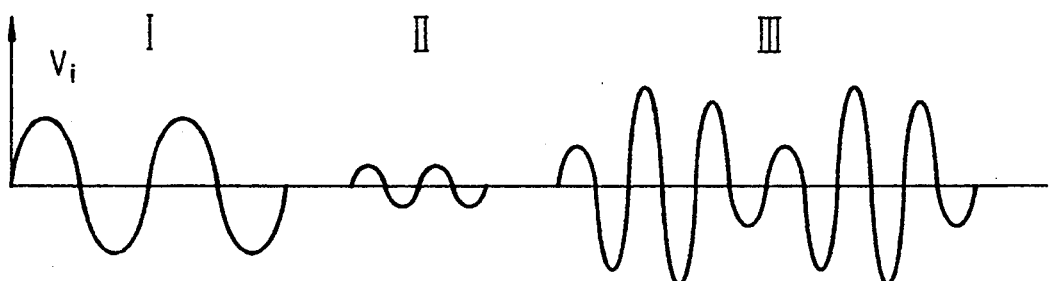
FIG. 11 to 15 show examples of various signals and their transformation.

FIG. 11 shows next to one another three different input signals $v_i(t)$, whereby the input signals $v_i(t)$ are sine-wave signals in the cases designated with I and II and a modulated sine-wave signal in the case designated with III.

Figure 12:
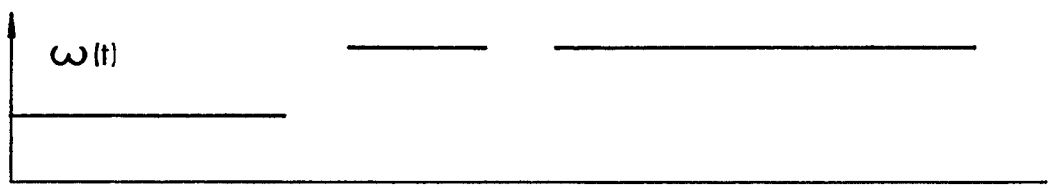

FIG. 12 shows the momentary frequency signals w(t) which belong to the input signals $v_i(t)$. It is obvious that the frequency in the cases II and III is twice as high as in the first case I.

Figure 13:
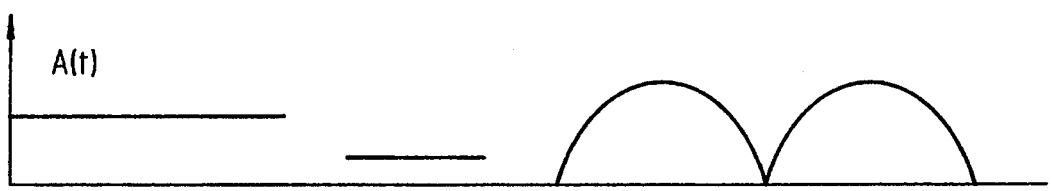

FIG. 13 shows the momentary amplitude signals A(t). In case II the amplitude is only half as big as in case I. In the third case III, however, the momentary amplitude signal function fluctuates periodically.

Figure 14:
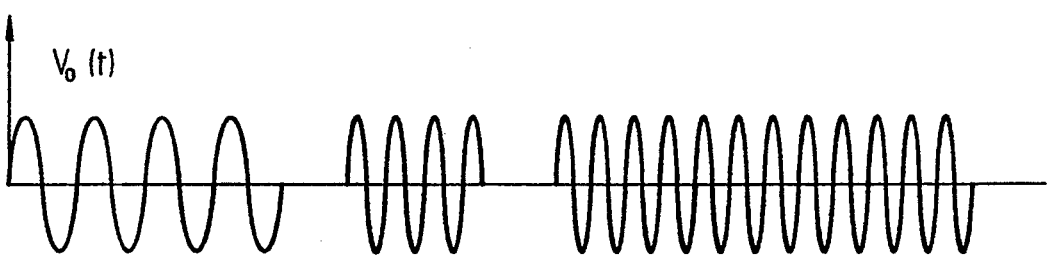
Figure 15:
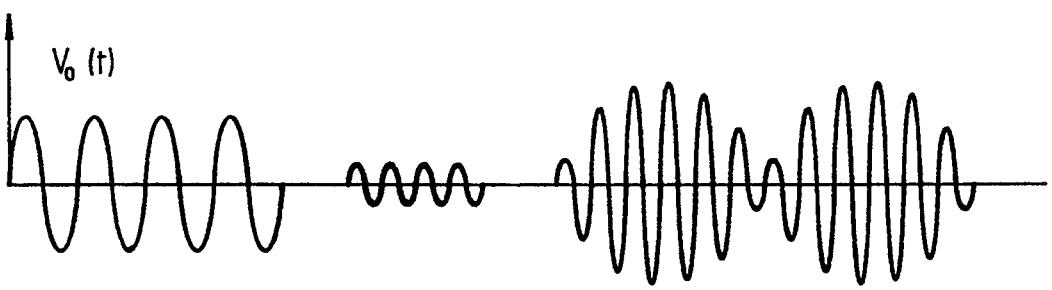

FIG. 14 shows the output signals $v_o(t)$ which are equivalent to the circuits of FIGS. 1 to 3. It is assumed that the circuits are tuned in such a way that the frequency of the input signal $v_i(t)$ is doubled. The amplitude of the output signal $v_o(t)$ does not depend on that of the input signal $v_i(t)$. The frequency is also doubled in the output signals $v_o(t)$ of FIG. 15. Such a signal $v_o(t)$, which could be gained with the circuit of FIG. 4, for example, shows the same amplitude as the input signal $v_i(t)$. This is quite obvious if one takes into account that the signal v(t) of constant amplitude is multiplied with the amplitude signal. Non-linear distortions are not accounted for in FIGS. 14 and 15.

I claim:

1. A method for shifting the frequency of an input signal $v_i(t)$, comprising the steps of:

(a) generating an analytical signal including two Hilbert signals $h_1(t)$ and $h_2(t)$, each Hilbert signal having an energy spectrum equivalent to an energy spectrum of the input signal $v_i(t)$;

(b) differentiating each Hilbert signal to generate differentiated Hilbert signals $d_1(t)$ and $d_2(t)$;

(c) generating a signal $wA(t)$ by taking the square root of the sum of the squares of the differentiated Hilbert signals $d_1(t)$ and $d_2(t)$;

(d) generating a momentary amplitude signal $A(t)$ by taking the square root of the sum of the squares of the Hilbert signals $h_1(t)$ and $h_2(t)$;

(e) dividing the signal $wA(t)$ by the momentary amplitude signal $A(t)$ to generate a momentary frequency signal $w(t)$; and (f) generating an output signal $v_o(t)$ with a momentary frequency equivalent to the momentary frequency signal $w(t)$.

2. The method of claim 1, further comprising the step of:

driving a voltage-controlled oscillator (VCO) with the momentary frequency signal $w(t)$, following said step of dividing.

3. The method of claim 1, further comprising the step of:

driving a voltage-controlled oscillator (VCO) with the momentary frequency signal $w(t)$ via an attenuation network, following said step of dividing.

4. The method of claim 1, further comprising the step of:

amplifying the momentary frequency signal $w(t)$ in a non-linear manner, following said step of dividing.

5. The method of claim 1, further comprising the step of:

attenuating the momentary frequency signal $w(t)$ in a non-linear manner, following said step of dividing.

6. The method of claims 1, 2, 3, 4 or 5, wherein said output signal $v_o(t)$ is generated by a voltage-controlled oscillator and thereafter multiplied with the momentary amplitude signal $A(t)$, the level of the momentary amplitude signal $A(t)$ is proportional to the momentary amplitude of the input signal $v_i(t)$.

7. The method of claim 6, wherein the momentary amplitude signal is amplified in a non-linear manner before being multiplied.

8. The method of claim 6, wherein the momentary amplitude signal is attenuated in a non-linear manner before being multiplied.

9. A method for generating a momentary frequency signal $w(t)$ of an input signal $v_i(t)$, comprising the steps of:

(a) generating an analytical signal including two Hilbert signals $h_1(t)$ and $h_2(t)$, each Hilbert signal having an energy spectrum equivalent to an energy spectrum of the input signal $v_i(t)$;

(b) generating a momentary amplitude signal $A(t)$ by taking the square root of the sum of the squares of the Hilbert signals $h_1(t)$ and $h_2(t)$, the momentary amplitude signal $A(t)$ being proportional to a momentary amplitude of the input signal $v_i(t)$;

(c) differentiating each Hilbert signal to generate differentiated Hilbert signals $d_1(t)$ and $d_2(t)$;

(d) generating a signal $wA(t)$ by taking the square root of the sum of the squares of the differentiated Hilbert signals $d_2(t)$ and $d_2(t)$; and (e) dividing the signal $wA(t)$ by the momentary amplitude signal $A(t)$ to generate the momentary frequency signal $w(t)$.

10. A method for generating a momentary frequency signal $w'(t)$ of an input signal $v_i(t)$, comprising the steps of:

(a) generating an analytical signal including two Hilbert signals $h_1(t)$ and $h_2(t)$, each Hilbert signal having an energy spectrum equivalent to an energy spectrum of the input signal $v_i(t)$;

(b) adding the absolute values of the two Hilbert signals to generate a signal $G(t)$;

(c) differentiating each Hilbert signal to generate differentiated Hilbert signals $d_1(t)$ and $d_2(t)$;

(d) adding the absolute values of the two differentiated Hilbert signals to generate a signal $H(t)$; and (e) dividing the signal $H(t)$ by the signal $G(t)$ to generate the momentary frequency signal $w'(t)$ 11. A device for shifting the frequency of an audio input signal $v_i(t)$ in hearing aids, the device comprising:

(a) an analytical circuit (AS) including (i) means for generating two Hilbert signals $h_1(t)$ and $h_2(t)$ based on the input signal $v_i(t)$;

(ii) means for generating a momentary amplitude signal $A(t)$ by taking the square root of the sum of the squares of the Hilbert signals $h_1(t)$ and $h_2(t)$;

(iii) means for differentiating each Hilbert signal $h_1(t)$ and $h_2(t)$ to generate differential Hilbert signals $d_1(t)$ and $d_2(t)$;

(iv) means for generating a signal $wA(t)$ by taking the square root of the sum of the squares of the differentiated Hilbert signals $d_1(t)$ and $d_2(t)$; and (v) means for generating a momentary frequency signal $w(t)$ by dividing the signal $wA(t)$ by the momentary amplitude signal $A(t)$;

(b) a voltage controlled oscillator (VCO) connected to said analytical circuit (AS) for receiving the momentary frequency signal $w(t)$ and generating a voltage controlled oscillator output $v(t)$; and (c) a multiplier (M) with two inputs, one of said inputs being connected to said voltage controlled oscillator (VCO) for receiving said voltage controlled oscillator output $v(t)$ and the other of said inputs being connected to said analytical circuit (AS) for receiving the momentary amplitude signal $A(t)$, wherein said multiplier (M) multiplies said momentary amplitude signal $A(t)$ and said voltage controlled oscillator output $v(t)$ to generate an output signal $v_o(t)$.

12. The device of claim 11, additionally including a non-linear transformer (NLP$_2$) connected between said analytical circuit (AS) and said multiplier (M).

13. The device of claim 11, wherein said analytic circuit (AS) comprises:

(a) a Hilbert circuit (HS) for generating two Hilbert signals $h_1(t)$ and $h_2(t)$ based on the input signal $v_i(t)$;

(b) two differentiators connected to said Hilbert circuit (HS) for generating differentiated Hilbert signals $d_1(t)$ and $d_2(t)$;

(c) a first combinatorial circuit (VS$_1$) connected to said Hilbert circuit (HS) for generating an output signal $A(t)$ according to the formula $$A(t) = \sqrt{h_1^2(t) + h_2^2(t)}\ ;$$

(d) a second combinatorial circuit (VS$_2$) connected to said two differentiators for generating an output signal $wA(t)$ according to the formula $$wA(t) = \sqrt{d_1^2(t) + d_2^2(t)} \; ; \text{ and}$$

(e) a divider circuit (DS) connected to said first and second combinatorial circuits (VS$_1$ and VS$_2$) for generating a momentary frequency signal w(t) according to the formula $$w(t) = wA(t)/A(t).$$

14. The device of claim 11, wherein said analytical circuit (AS) comprises:
 (a) a Hilbert circuit (HS) for generating two Hilbert signals h$_1$(t) and h$_2$(t) based on the input signal v$_i$(t);
 (b) two differentiators connected to said Hilbert circuit (HS) for generating differentiated Hilbert signals d$_1$(t) and d$_2$(t);
 (c) a first absolute value adder (BA$_1$) for generating an output signal G(t) according to the formula $$G(t) = |h_1(t)| + |h_2(t)|$$

(d) a second absolute valve adder (BA$_2$) for generating an output signal H(t) according to the formula $$H(t) = |d_1(t)| + |d_2(t)|;$$

and
 (e) a divider circuit (DS) connected to said first and second absolute value adders (BA$_1$ and BA$_2$) for generating an output signal w'(t) according to the formula $$w'(t) = H(t)/G(t).$$

15. A device for shifting the frequency of an input signal v$_i$(t), comprising:
 a frequency signal circuit (FSS) for generating a momentary frequency signal w(t) based on the input signal v$_i$(t), said frequency signal circuit (FSS) including:
 (a) a Hilbert circuit (HS) for generating two Hilbert signals h$_1$(t) and h$_2$(t) based on the input signal v$_i$(t);
 (b) two differentiators connected to said Hilbert circuit (HS) for generating differentiated Hilbert signals d$_1$(t) and d$_2$(t);
 (c) a first combinatorial circuit (VS$_1$) connected to said Hilbert circuit (HS) for generating an output signal A(t) according to the formula $$A(t) = \sqrt{h_1^2(t) + h_2^2(t)} \; ;$$

(d) a second combinatorial circuit (VS$_2$) connected to said two differentiators for generating an output signal wA(t) according to the formula $$wA(t) = \sqrt{d_1^2(t) + d_2^2(t)} \; ; \text{ and}$$

(e) a divider circuit (DS) connected to said first and second combinatorial circuits (VS$_1$ and VS$_2$) for generating a momentary frequency signal w(t) according to the formula $$w(t) = wA(t)/A(t);$$

and
 a voltage-controlled oscillator (VCO) connected to said frequency signal circuit (FSS) for generating a frequency-shifted output based on the momentary frequency signal w(t).

16. The device of claim 15, wherein said Hilbert circuit (HS) comprises at least two all-pass circuits.

17. The device of claim 16, further comprising
 a crossover (FW) for dividing the input signal v$_i$(t) into two separate frequency band signals; and
 two pairs of all-pass circuits (AP$_1$, AP$_2$, AP$_3$, AP$_4$) connected to said crossover (FW), each pair receiving one of the frequency band signals.

18. A device for shifting the frequency of an input signal v$_i$(t), comprising:
 a frequency signal circuit (FSS) for generating a momentary frequency signal w(t) based on the input signal v$_i$(t), said frequency signal circuit (FSS) including:
 (a) a Hilbert circuit (HS) for generating two Hilbert signals h$_1$(t) and h$_2$(t) based on the input signal v$_i$(t);
 (b) two differentiators connected to said Hilbert circuit (HS) for generating differentiated Hilbert signals d$_1$(t) and d$_2$(t);
 (c) a first absolute value adder (BA$_1$) for generating an output signal G(t) according to the formula $$G(t) = |h_1(t)| + |h_2(t)|;$$

(d) a second absolute valve adder (BA$_2$) for generating an output signal H(t) according to the formula $$H(t) = |d_1(t)| + d_2(t)|;$$

and
 (e) a divider circuit (DS) connected to said first and second absolute value adders (BA$_1$ and BA$_2$) for generating an output signal w'(t) according to the formula $$w'(t) = H(t)/G(t);$$

and
 a voltage-controlled oscillator (VCO) connected to said frequency signal circuit (FSS) for generating a frequency-shifted output based on the momentary frequency signal w(t).

19. The device of claim 18, wherein said Hilbert circuit (HS) comprises at least two all-pass circuits.

20. The device of claim 19, further comprising
 a crossover (FW) for dividing the input signal v$_i$(t) into two separate frequency band signals; and
 two pairs of all-pass circuits (AP$_1$, AP$_2$, AP$_3$, AP$_4$) connected to said crossover (FW), each pair receiving one of the frequency band signals.

* * * * *